(12) United States Patent
Suitor et al.

(10) Patent No.: US 7,518,883 B1
(45) Date of Patent: Apr. 14, 2009

(54) BACKPLANE ARCHITECTURE FOR ENABLING CONFIGURATION OF MULTI-SERVICE NETWORK ELEMENTS FOR USE IN A GLOBAL VARIETY OF COMMUNICATIONS NETWORKS

(75) Inventors: Craig Suitor, Nepean (CA); Balwantrai Mistry, Nepean (CA); Doug Wong, Gloucester (CA); Christopher Brown, Ottawa (CA)

(73) Assignee: Nortel Networks Limited, St. Laurent, Quebec (CA)

( * ) Notice: Subject to any disclaimer, the term of this patent is extended or adjusted under 35 U.S.C. 154(b) by 625 days.

(21) Appl. No.: 10/961,441

(22) Filed: Oct. 8, 2004

Related U.S. Application Data

(60) Provisional application No. 60/510,030, filed on Oct. 9, 2003, provisional application No. 60/510,031, filed on Oct. 9, 2003.

(51) Int. Cl.
*H01R 12/16* (2006.01)
(52) U.S. Cl. ................ 361/788; 361/679; 361/683; 361/685; 361/687; 361/803
(58) Field of Classification Search ................ 361/600, 361/679, 683, 728, 736, 784, 785, 788, 796, 361/685, 687, 803; 370/387, 389, 400, 406; 398/50
See application file for complete search history.

(56) References Cited

U.S. PATENT DOCUMENTS

| | | | | |
|---|---|---|---|---|
| 4,967,311 A | * | 10/1990 | Ferchau et al. | 361/736 |
| 5,040,170 A | * | 8/1991 | Upp et al. | 398/50 |
| 5,648,892 A | * | 7/1997 | Wieloch et al. | 361/788 |
| 6,014,319 A | * | 1/2000 | Kuchta et al. | 361/788 |
| 6,519,145 B1 | * | 2/2003 | Biran et al. | 361/687 |
| 6,587,461 B1 | * | 7/2003 | Parrish et al. | 370/387 |
| 6,611,526 B1 | * | 8/2003 | Chinnaswamy et al. | 370/406 |
| 6,738,463 B2 | * | 5/2004 | Schmokel | 379/166 |
| 6,754,854 B2 | * | 6/2004 | Kurrasch | 714/47 |
| 6,888,791 B1 | * | 5/2005 | Ellis et al. | 370/227 |
| 6,906,914 B2 | * | 6/2005 | Stamos et al. | 361/683 |
| 7,203,846 B2 | * | 4/2007 | Bresniker et al. | 713/300 |

(Continued)

OTHER PUBLICATIONS

ADC Telecommunications, Inc./Cellworx STN SNMP Interface user Guide/Mar. 2000/Issue 1.*

(Continued)

*Primary Examiner*—Dean A. Reichard
*Assistant Examiner*—Xiaoliang Chen
(74) *Attorney, Agent, or Firm*—Guerin & Rodriguez, LLP; Michael A. Rodriguez

(57) ABSTRACT

A multi-service network element is configurable for use in various types of communications networks. The network element has a service interface card, a service interface electrical connector for receiving the service interface card, an I/O electrical connector for receiving an I/O module, and a backplane. The backplane has a first side, an opposite side, a first means for electrically connecting the service interface electrical connector to the first side, and a second means for electrically connecting the I/O electrical connector to either side of the backplane. The backplane is partitioned into columns and rows of electrical connectors. Each column corresponds to a card slot for receiving a circuit pack and each row corresponds to a section of the backplane having traces for carrying a particular type of electrical signals between circuit packs.

21 Claims, 7 Drawing Sheets

U.S. PATENT DOCUMENTS

| | | | |
|---|---|---|---|
| 7,263,597 B2 * | 8/2007 | Everdell et al. | 712/11 |
| 7,395,323 B2 * | 7/2008 | Larson et al. | 709/222 |
| 7,447,778 B2 * | 11/2008 | Matters et al. | 709/227 |
| 2002/0001307 A1 * | 1/2002 | Nguyen et al. | 370/386 |
| 2002/0145858 A1 * | 10/2002 | Hayashi et al. | 361/798 |
| 2004/0066615 A1 * | 4/2004 | Pavesi et al. | 361/683 |

OTHER PUBLICATIONS

Cisco systems, inc./ONS 15454 User Documentation/Mar. 15, 2000/ Cisco Systems, Inc./Software releaase 2.1.0.*

XEL Communications, Inc./XEL Arcadacs 100 Digital Access Cross-connect System Reference Guide/Jul. 2003/XEL Communicaitons, Inc./9ZX-ACDX-USRS-2.5.10R.01.*

* cited by examiner

BACKPLANE ARCHITECTURE FOR ENABLING CONFIGURATION OF MULTI-SERVICE NETWORK ELEMENTS FOR USE IN A GLOBAL VARIETY OF COMMUNICATIONS NETWORKS

RELATED APPLICATIONS

This application claims the benefit of the filing date of U.S. Provisional Application Ser. No. 60/510,030, filed Oct. 9, 2003, titled "Multi-Service Platform Backplane of a Network Element," and the benefit of the filing date of U.S. Provisional Application Ser. No. 60/510,031, filed Oct. 9, 2003, titled "Multi-Service Optical Network Element." The entireties of both such provisional applications are incorporated by reference herein.

FIELD OF THE INVENTION

The invention relates generally to telecommunications networks. More particularly, the invention relates to a multi-service network element configurable for deployment in a global variety of communications networks.

BACKGROUND

The general requirements for constructing and operating a telecommunications network can vary considerably throughout the world, from one continent to another, from one country to another, and from one region to another. As an example, synchronous data communications in an optical network can use one of variety of physical layer communication protocols (e.g., Synchronous Optical Network (SONET) or Synchronous Digital Hierarchy (SDH)). SONET is the standard for optical transport of synchronous data communications in North America and SDH is the European variant. The SONET standard is similar to the SDH standard in many respects. For example, SONET and SDH each uses time-division multiplexing (TDM) to aggregate multiple low-order data blocks into high-order data blocks, called frames (e.g., Synchronous Transport Signal (STS) frames). However, one significant difference between the standards is the basic unit of payload data. In SONET, the basic unit is an STS-1, which corresponds to a signal rate of approximately 50 Mbit/s. In SDH, the basic unit is an AU-4 with a signal rate of approximately 150 Mbits/s. Further, low-order SONET data blocks, called Virtual Tributaries (VTs), can have different signal rates than low-order SDH data blocks, called Tributary Units (TUs).

In addition to these and other signal rate differences, different national and regional markets throughout the world can have different physical requirements regarding the size of the network elements and the racks into which the network elements are arranged. Another difference concerns the direction in which the cooling system can exhaust air. Further, as another example, North American standards permit input/output (I/O) connections to terminate at the rear-side of the rack, a practice not typically followed by European standards.

To be able to supply network elements that satisfy the requirements of the various global markets, the telecommunications industry typically offers distinct product lines. These often include, for example, one product line for SDH-compliant product and another for SONET-compliant product. The management of separate staffing, accounting, and component inventories for multiple product lines can consequently lead to higher costs. Accordingly, it is advantageous to provide a network element that is configurable for deployment in a global variety of communications networks.

SUMMARY

In one aspect, the invention features a network element configurable for use in various types of communications networks. The network element includes a service interface card, a service interface electrical connector for receiving the service interface card, an I/O electrical connector for receiving an I/O module that carries electrical signals associated with one or more electrical services to and from the network element, and a backplane. The backplane has a first side, an opposite side, a first means for electrically connecting the service interface electrical connector to the first side, and a second means for electrically connecting the I/O electrical connector to either side of the backplane. At least one electrical trace electrically connects the first connecting means to the second connecting means so that the service interface card connected to the front side of the backplane can communicate with the I/O module connected to either side of the backplane.

In another aspect, the invention features a network element configurable for use in various types of communications networks. The network element includes means for forwarding network traffic received over a communications network and a backplane having a first side and an opposite side. The network element also includes a first means for connecting the forwarding means to the first side of the backplane and a second means for connecting an I/O module to either side of the backplane based on whether the network element is being configured for a first type of communications network or for a second type of communications network. Also included are means for electrically connecting the first connecting means to the second connecting means in order to provide an electrical connection between the forwarding means and the I/O module.

In still another aspect, the invention features a network element configurable for use in various types of communications networks. The network element includes a plurality of circuit packs and a backplane having a plurality of columns of electrical connectors and a plurality of rows of electrical connectors attached on one side of the backplane. Each column of electrical connectors corresponds to a card slot for receiving one circuit pack of the plurality of circuit packs. Each row of electrical connectors corresponds to a section of the backplane with electrical traces for carrying a particular type of electrical signals between circuit packs.

In yet another aspect, the invention features a method for configuring a network element for use in various types of communications networks. A backplane having a first side and an opposite side is provided. A plurality of service interface cards is connected to the first side of the backplane. An I/O module is connected to the first side of the backplane if the network element is to be configured for the first type of communications network; otherwise, the I/O module is connected to the opposite side of the backplane if the network element is to be configured for the second type of communications network.

BRIEF DESCRIPTION OF THE DRAWINGS

The above and further advantages of this invention may be better understood by referring to the following description in conjunction with the accompanying drawings, in which like numerals indicate like structural elements and features in various figures. The drawings are not necessarily to scale, emphasis instead being placed upon illustrating the principles of the invention.

FIG. 7A is a system block diagram of an embodiment of the network element of FIG. 4 having two additional card slots with service interface cards installed therein.

FIG. 7B is a system block diagram of an embodiment of the network element of FIG. 4 having four additional card slots with service interface cards installed therein.

DETAILED DESCRIPTION

Figure 1:
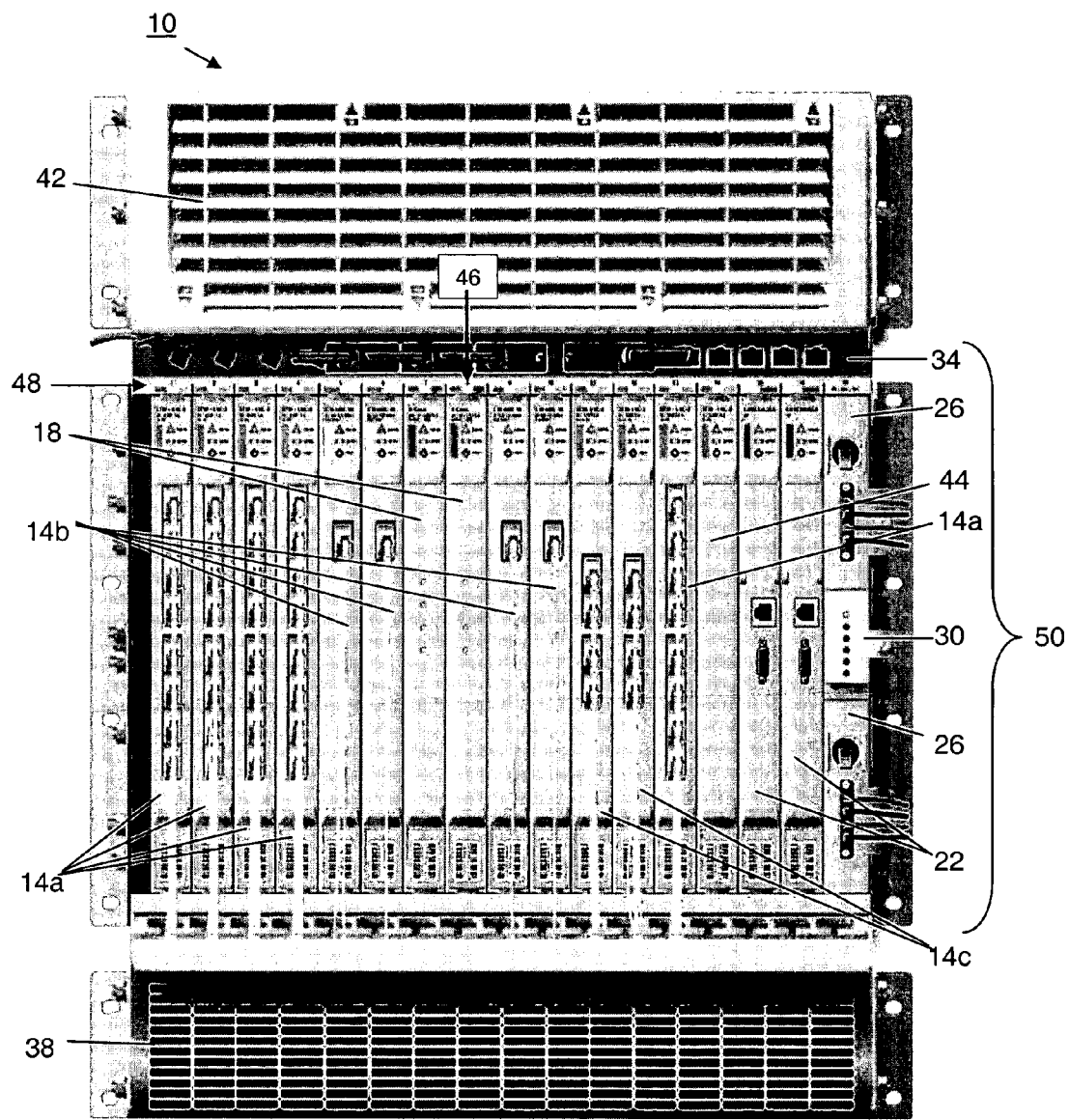
FIG. 1 is a front view of an embodiment of a network element constructed in accordance with the principles of the invention.

The present invention features a single global platform capable of supporting PDH, SONET, SDH, transparent, and data services, with modularity, flexibility, and service mix. This global platform enables different configurations of optical and electrical/optical network elements capable of supporting various services. Supported services include, but are not limited to, OC-3/12/48/192/768, STM-1/4/16/64/256, 2.5/10G 4λ/32λ/64λ, OTN (Optical Transport Network), E4, STM-1e, E1/DS1, DS3/E3, 10/100BT, 1000BT, Gigabit Ethernet (GE), 10GE, and Fibre Channel (FC). In "plug-and-play" fashion, network elements embodying the invention are configurable to support a mix of different services. These network elements are also configurable to function in SONET, SDH, PDH, JDH, DWDM, data telecommunications networks in a variety of roles, including as high-end Customer Located Equipment (CLE) head-end systems, head-end consolidation systems, core/IOF (Interoffice Facilities) transport systems, and high-end core transport and fiber relief systems.

More specifically, the global platform includes a backplane to which and by which the various service interface cards, cross-connect cards, and shelf processor cards of the network element connect and communicate. Network elements or shelves constructed with this backplane can have one of at least three shelf configurations: 1) a front electrical/optical shelf; 2) a rear electrical/optical shelf; and 3) an optical shelf. Front electrical/optical shelves have optical service interface cards, one or more electrical service interface cards, and I/O modules connected on the front side of the shelf. Rear electrical/optical shelves have optical service interface cards, one or more electrical service interface cards, and I/O modules connected on the rear side of the shelf. The backplane employs I/O connectors that enable the connecting of the I/O modules to either side of the backplane. By connecting the I/O modules to the appropriate side of the backplane, a network can thus be configured for deployment in markets having different requirements, for example, in North American markets, which generally permit I/O connections on the rear side, and in European markets, which generally require the I/O connections on the front side.

Optical shelves have optical service interface (or port) cards and no electrical service interface cards or electrical I/O modules. An optical shelf can support electrical services using pluggable modules on the faceplate. An example of this configuration includes an STM-1e SFP (small form-factor pluggable) that is plugged into an STM-1/STM-4 SFP interface card. (STM-1s are supportable in an optical version and an electrical version. The optical version is referred to as an STM-1, whereas the electrical version is referred to as an STM-1e.)

The backplane also accommodates different detachable cooling systems. Being able to separate the cooling system from the network element enables different stacking arrangements and rack configurations. Because global markets have different cooling requirements (e.g., front versus rear air exhaust), a network element can be equipped with a cooling system that is appropriate for the type of market in which that network element is to be deployed. Also, the arrangement of the various cards within the network element, as determined by the layout of the card and I/O module connectors on the backplane, permits sufficient airflow through the network element irrespective of the particular cooling system used.

This backplane layout also uses partitioning to keep related signal types together and to make efficient use of the space on the backplane. In general, the partitioning defines separate and distinct sections of the backplane that extend horizontally across the vertical card slots of the shelf. Within one horizontal section are power signals; within another, control signals; within still another, traffic signals; within yet another, electrical interface signals, and within still yet another, I/O module connections. This partitioning technique accommodates expansion of the backplane in both the horizontal and vertical directions. The backplane layout also enables other capabilities of a network element, including 1:N equipment protection for multiple services, wavelength transponder configurations (without cross-connect cards), and short electrical trace lengths between high-speed interface cards and cross-connect cards.

FIG. 1 shows one embodiment of a network element 10 constructed in accordance with the invention, for use in a telecommunications network. This particular network element 10 has an optical shelf configuration and includes a plurality of service interface cards 14a, 14b, 14c (generally, service interface card 14), redundant cross-connect cards 18, redundant shelf-processor cards 22, redundant power cards 26, and a maintenance interface card 30. A general reference to a circuit pack applies to any one of the cards 14a, 14b, 14c, 18, and 22. The various cards 14, 18, 22, 26, and 30 connect to a backplane (FIG. 6) by which the cards communicate with each other. The network element 10 also includes a detachable access panel 34, a detachable air plenum (inlet) 38, and a detachable fan module 42. The fan module 42 and air plenum 38 attach to the top and bottom, respectively, of a chassis 50 that houses the various cards.

In one embodiment, the chassis 50 has a 300 mm (12 inch) depth, a 25 mm card pitch across all slots (with the exception of the slot occupied by the power and MIC cards, which is wider), and a width sized to fit into 483 mm or 19" EIA (Electronic Industries Association) and ETSI (European Telecommunications Standards Institute) racks. The pitch determines the number of slots that can fit into the chassis 50. The number of slots determines the type of traffic services that the network element 10 can support. The pitch also affects the cooling capacity of the network element and influences which connector technology can be uses to connect cards and I/O modules to the backplane. The connector technology determines the service density (i.e., the number of services, such as E1 and DS3 electrical services, that a single card can support).

The network element 10 represents an example configuration. Network elements of the invention can have other configurations with different card selections and different card arrangements without departing from the principles of the invention. In this particular embodiment, the network element 10 has seventeen numbered vertical slots 46. Each card 14, 18, 22 occupies one slot. Service interface cards 14a occupy slots numbered 1 through 4, inclusive and slot number 13. Service interface cards 14b occupy slots numbered 5, 6, 9, and 10. Service interface cards 14c occupy slots 11 and 12. The redundant XC cards 18 occupy slots 7 and 8. Preferably, the XC cards 18 are centrally located between the service interface cards 14a, 14b, and 14c to produce a fan-out of electrical trace lengths on the backplane from the service interface cards 14 to each XC card 18. Having the XC cards 18 in the middle generally keeps trace lengths shorter in comparison to having XCs cards 18 either on the left or on the right side of the shelf, which would require trace lengths that extend across the shelf. High-speed (HS) service interface cards (i.e., 10G signal rates) have more traces than any of the other types of service interface cards and, preferably, are located closer to the XC cards 18 than any of the other types of service interface cards. For transponder applications, which have no XC cards, optical service interface cards can occupy slots 7 and 8. The redundant SP cards 22 occupy slots 15 and 16. The power cards 26 and MIC 30 occupy one slot, with one power card 26 being disposed above and the other card 26 below the MIC 30. Filler cards 44 can occupy unused slots (e.g., here, slot 14).

Each service interface card 14, also known as a port card, service card, traffic card, or tributary card, has SDH- and SONET-compliant physical interfaces for transmitting and receiving customer traffic according to the appropriate optical transport standard, a processor, and a backplane interface for communicating with the XC cards 18 over the backplane. In the ingress direction, each service interface card 14 receives a customer signal, monitors the signal for faults and for bit error performance, and maps the signal into a signal format (e.g., synchronous transport signal) that the XC cards 18 can process. In the egress direction, each service interface card 14 receives a signal from the XC card 18, monitors the integrity of the signal, and maps the signal into a format required by the transmit interface (i.e., physical interface) of the service interface card.

Using different types of service interface cards 14, network elements of the invention can provide the transport and aggregation of asynchronous private lines, SONET, SDH, and optical broadband services, including transparent wavelengths. The particular embodiment of network element 10 shown in FIG. 1 uses three types of service interface cards: service interface cards 14a, 14b, and 14c. Each of the cards 14a, 14b, 14c support unprotected, and 1+1/MSP linear, UPSR/SNCP, and BLSR/MS-SPRing traffic protection schemes. It is to be understood that the types of cards described herein are exemplary and represent one particular configuration of a network element. Many other configurations are possible without departing from the principles of the invention.

Any service interface slot (i.e., slots 1-14) can receive a service interface card 14a. Each service interface card 14a has eight ports. Each port is individually configurable to support OC-3, OC-12, STM-1, STM-1e, or STM-4 services. The ability to configure ports individually enables the handling of mixed services (i.e., two different types of services or different service rates). Thus, the network element can handle mixed services on the same service interface card or on different service interface cards.

The service interface cards 14b, also referred to as high-speed signal interface cards, have a single port for supporting a 10G signal rate for OC-192 (SONET) or STM-64 (SDH) services. Another embodiment of the service interface cards 14b also supports DWDM (Dense Wave Division Multiplexing). Although preferably located near the XC cards 18, installation of the service interface cards 14b can occur in any service interface slot.

The service interface cards 14c each have four ports for supporting Gigabit Ethernet (GE) services. Like the other service interface cards 14a and 14b, the service interface cards 14c can operate in any service interface slot of the network element.

These service interface cards 14a, 14b, and 14c are examples of the types of service interface cards that the global platform of the invention can support. The invention applies also to other types of service interface cards than those shown. For example, higher density service interface cards than those described, for example, 16-port OC-3 cards and 2-port 10G cards, can be used to practice the invention. In general, the service interface cards that can be part of the network element correspond to three basic categories of supportable services: 1) SONET/SDH; 2) broadband services; and 3) PDH (plesiochronous digital hierarchy). SONET and SDH services include OC-3/STM-1o, STM-1e, OC-12/STM-4, OC-48/STM-16, and OC-192/STM-64 service interfaces (and variants including 1310 nm, 1550 nm, VSR, and DWDM). The global platform can also support OC-768/STM-256 interface rates, if needed. Supported broadband services include Gigabit Ethernet (GE), Fibre Channel (FC), FICON, 2.5G wavelengths, 10G wavelengths, 10/100Base-T, 1000Base-T, Optical Data Unit 1 (ODU1), Optical Data Unit 2 (ODU2), and flex-rate protocol and independent wavelengths. Supported PDH services include E1, DS1, E3, DS3, E4, and EC-1. Service interface cards supporting electrical signals (e.g., DS1, DS3) are generally referred to as electrical service interface cards; those supporting optical signals as optical service interface cards.

For optical service interface cards, incoming and outgoing optical signals enter and exit the service interface card through ports in the faceplate. Embodiments of service interface cards 14 have from one (e.g., an OC-192 port) to 32 ports. Each of the ports can have a pluggable interface that delivers the optical signal rates appropriate for the particular card. For electrical service interface cards, incoming and outgoing electrical signals pass through an input/output (I/O) module (FIG. 5A and FIG. 5B) before passing to or coming from the electrical service interface card by way of the backplane.

In general, service interface cards for supporting each of these categories of services can operate in any of the service interface slots and have multiple individually configurable ports. For example, an OC-48/STM-16 service interface card with two ports can have one port configured for OC-48 and the other for STM-16. As another example, a multi-port DWDM service interface card can have each port configured for a different wavelength. Further, the principles of the invention can extend to embodiments of network elements with fewer or more than the twelve service interface cards 14 shown in FIG. 1.

The redundant XC cards 18 provide a 1+1 equipment protection configuration. Various types of XC cards are suitable for use in the network element 10. For example, the XC cards 18 can be 80G or 160G cards with STS-1/VC-4 switching granularity, 80G/20G cards with VT1.5/VC-12 switching granularity (i.e., a 20G maximum limit of VT1.5/VC12 traffic), or 80G/80G cards with VT1.5/VC-12 switching granularity (i.e., a 80G maximum limit of VT1.5/VC12 traffic). The XC cards 18 provide connection management, synchronization, and a database backup of SP-specific information. Although FIG. 1 shows two XC cards 18, the principles of the invention can extend to embodiments of network elements with zero or one XC card.

The SP cards 22 manage external operations, administration, and maintenance (OAM) messaging directed to the network element 10, thus enabling external control of the network element and the various components. Other functions include managing OAM messaging among the other cards in the network element 10, managing software versions for the other cards, and providing a repository for the provisioning data of the network element 10. The SP cards 112 operate in parallel, one functioning as a master SP card and the other as a slave. The network element 10 can operate with one or two SP cards 22, and can continue to route and forward traffic and perform protection switching if an SP fails or is removed.

The network element supports redundant –48/60V DC power feeds through the power cards 26. If the power feed drops below a predefined voltage level, each power cards 26 can send a low-voltage indicator to the SP cards 22. The SP cards 22 can require both power cards 26 to send a low-voltage indicator before that SP card 22 determines that a brownout condition has occurred. Among other capabilities, the MIC card 30 includes light-emitting diodes that serve as visual indicators for critical, major, and minor alarms and for shelf power status.

Located near the top of the network element 10, the detachable access panel 34 provides access to OAM&P functions, such as external synchronization input (ESI) and external synchronization output (ESO), environmental and alarms. The access panel 34 also provides data communications interfaces to the network element 10 for dial-up modem access, DCN (data communication network) access, craft user interfaces, and co-located shelf interconnect. Access panels differ based on the particular application, e.g., European or North American. European applications require alarms and telemetry to be provided through a D-Sub connector and BITS (building integrated timing supply) through a D-Sub connector and BT43 (mini-coax) connector. North American applications require BITS, alarms, and telemetry to be provided through wire-wrap pins. Connectors for DCN access, such as COLAN (central office-based local area network), are common to both types of access panels 34. Other applications, such as Japan, can have other requirements. The particular type of access panel selected and connected to the network element is based on the intended application.

Figure 2:
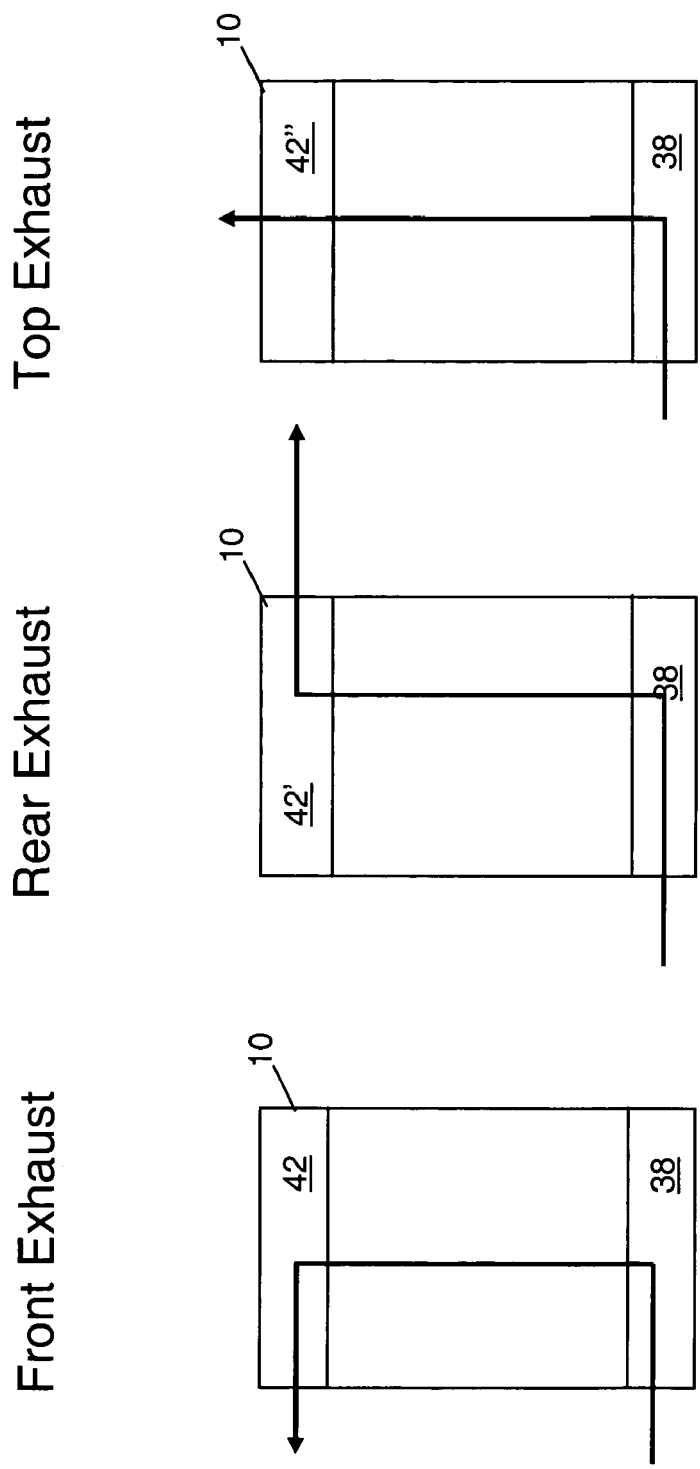
FIG. 2 is a set of side views of the network element showing three different cooling system configurations.

The cooling system of the network element 10 includes the air plenum 38 and fan module 42. The fan module 42 draws air through the air plenum 38 into the network element 10 from the bottom and exhausts the air in one of three directions: through the top, through the front, or through the rear. For each method of air exhaust, the cooling system uses a different type of fan module designed for that method. FIG. 2 shows side views of these different methods for exhausting air from the network element 10. Different reference numerals 42, 42', and 42" correspond to the different embodiments of fan modules.

Like the access panel 34, both the air plenum 38 and fan module 42 are separable from the network element 10. This modular construction enables the various air exhaust configurations described above and various shelf-stacking configurations, described below, for accommodating European and North American applications. For example, European applications commonly place multiple racks of network elements in a back-to-back arrangement, whereas North American applications do not. Accordingly, European applications generally do not deploy racks with network elements configured for rear air exhaust, but such network elements are acceptable for North American applications. Therefore, European applications may configure the network elements for a front or top air exhaust.

Figure 3A:
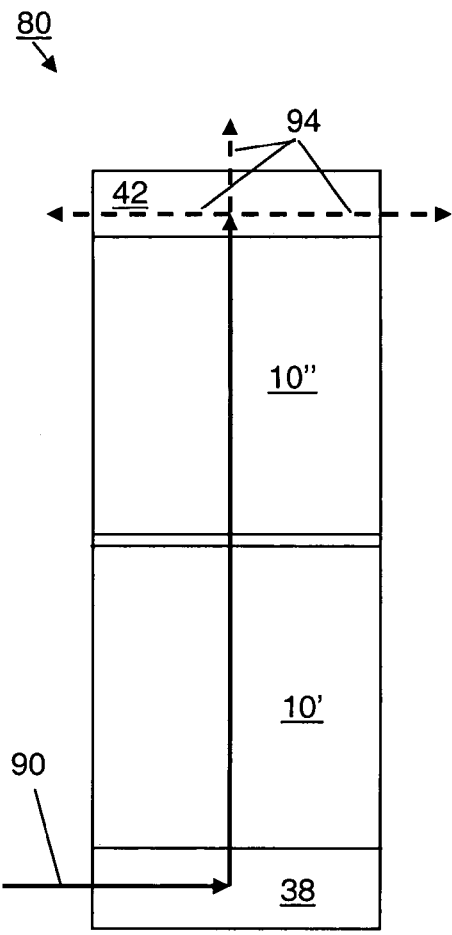
FIG. 3A is a side view of an embodiment of a stacked arrangement of two network elements of the invention.

Multiple network elements can also be stacked within a single rack for, e.g., European and North American applications. Preferably, for a network element stacked immediately below another network element, the fan module exhausts the air through the front or through the rear. The network element at the top of a stacking arrangement can have front or rear air exhaust, depending upon the application, or a top air exhaust configuration. In a stacking arrangement 80 comprised of two network elements 10', 10", as shown in FIG. 3A, a single air plenum 38 located below the lower network element 10' and a single fan module 42 located above the upper network element 10" are sufficient to cool both network elements. In a side view of the stacking arrangement 80, arrow 90 illustrates the general path taken by the drawn air. Dashed arrows 94 illustrate the possible air exhaust directions, depending upon the particular fan module 42 installed.

Figure 3B:
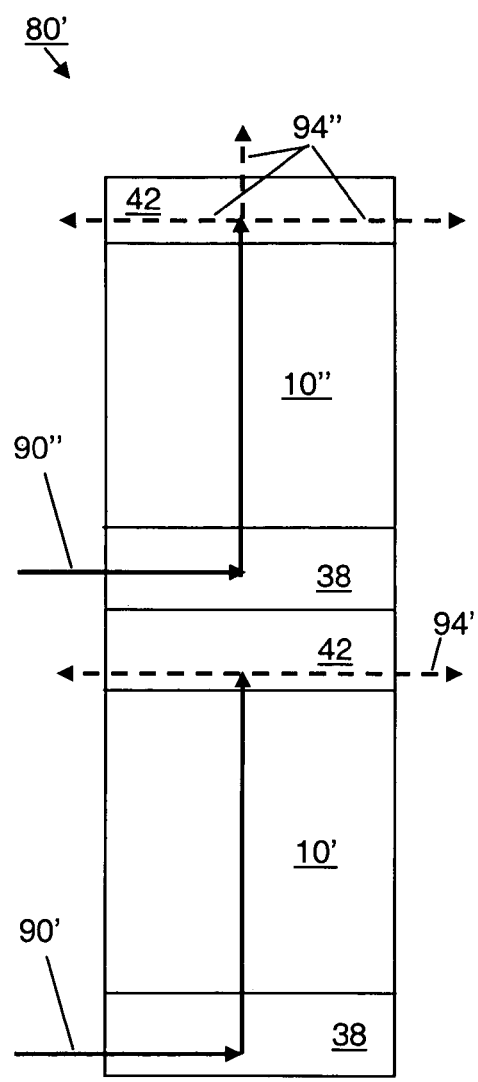
FIG. 3B is a side view of an alternative embodiment of a stacked arrangement of two network elements of the invention.

An alternative stacking arrangement 80' of two network elements 10', 10" has a fan module 42 and an air plenum 38 for each network element, as shown in the side view of FIG. 3B. Each fan module 42 draws air in through the respective air plenum 38, as illustrated by arrows 90', 90". Depending upon their configurations, the fan module 42 of the lower network element 10' exhausts air through the front or through the rear of the network element 10', while the fan module 42 of the upper network element 10" exhausts air through the front, rear, or the top, as illustrated by arrows 94', 94".

As many as four network elements in a stacked arrangement can fit within a 43U rack, depending upon the particular shelf configuration. The stacking arrangement can stack three network elements having optical shelf configuration, two front electrical/optical network elements, and four rear electrical/optical network elements. For example, a rack with four network elements can have a stacked pair of the stacking arrangements 80 shown in FIG. 3A.

Figure 4:
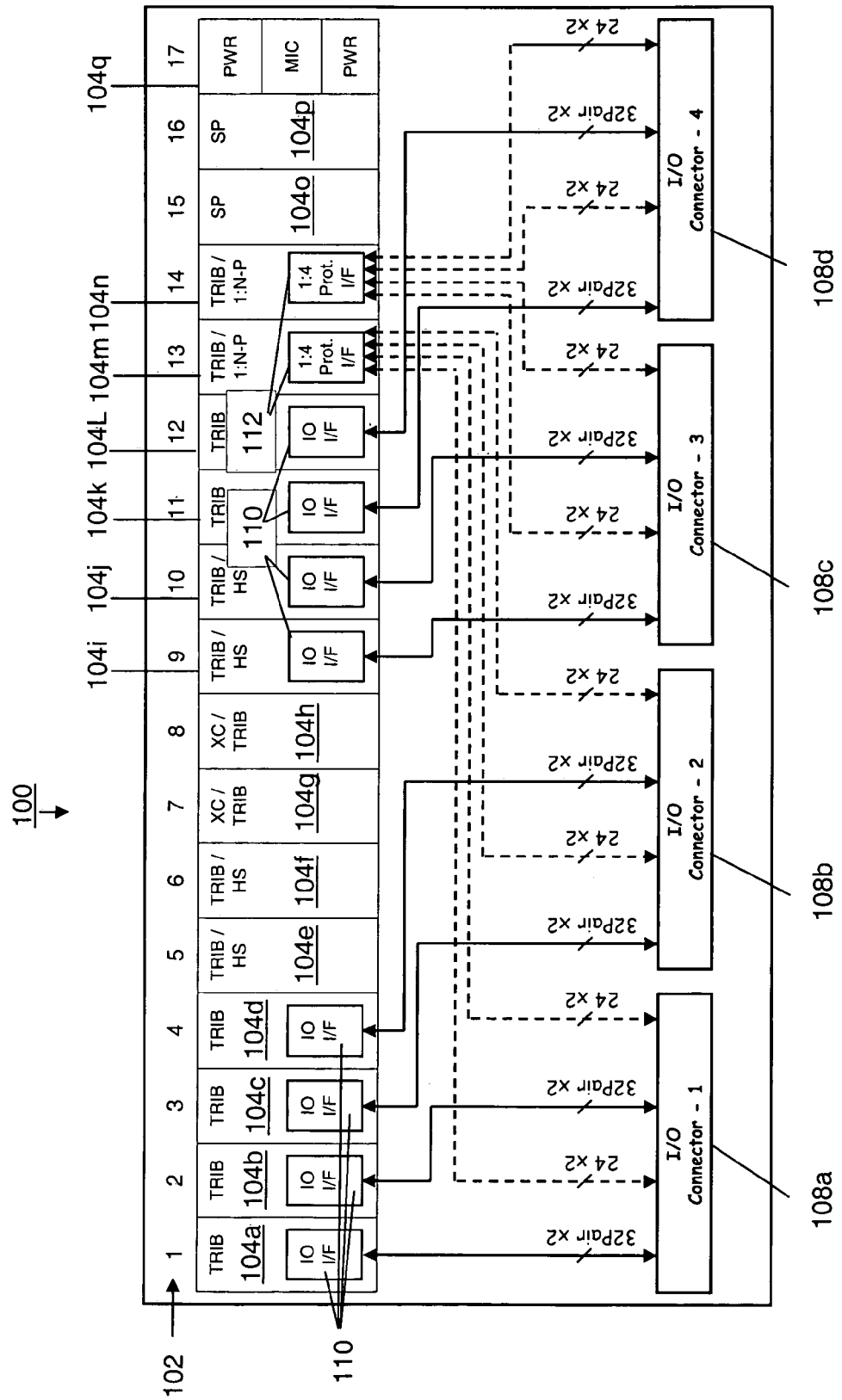
FIG. 4 is a system block diagram of an embodiment of a network element constructed in accordance with the invention.

FIG. 4 shows a system block diagram of a network element 100 constructed in accordance with the principles of the invention. The network element 100 has a plurality of numbered slots 102 (here, numbered from one to seventeen), backplane connectors 104a through 104q each for receiving a service interface card, a cross-connect card, a shelf processor, or redundant power cards, and I/O connectors 108a through 108d (generally, I/O connector 108) for receiving I/O modules. These I/O modules can deliver different types of electrical services, e.g., DS3, E1, to the network element 100. For example, I/O modules for DS3 services can be connected to I/O connectors 108a and 108b, while I/O modules for E1 services are connected to I/O connectors 108c and 108d.

Each of the slots numbered one through fourteen can receive an optical service interface card. If the shelf configuration of the network element 100 is to include high-speed (HS) service interface cards, each HS service interface card can slide into any one of the slots numbered five, six, nine, or ten. The four slots for HS service interface cards enable a fully filled shelf configuration in a linear add/drop multiplexer (ADM). If the shelf configuration is to include XC cards, such XC cards enter slots numbered seven and eight. Shelf processor cards occupy slots fifteen and sixteen, and the power cards occupy slot seventeen.

The service interface cards 14 are paired (e.g., slots 1 and 2, slots 3 and 4)) for implementing various protection schemes, such as 1+1 protection. Links (not shown) on the backplane provide communication paths between pairs of service interface cards 14 that are physically adjacent to each other in the network element 100. Some service interface cards in some embodiments are double-width and occupy two slots of the network element 100. For this type of service interface card, the links are double-width links so that one double-width service interface card can communicate with an adjacent double-width service interface card.

Network elements of the invention can also have an electrical/optical configuration. Electrical/optical configurations (front and rear) include electrical service interface cards with I/O interfaces 110. Such electrical service interface cards can occupy slots numbered one through four and nine through twelve. The I/O interface 110 of each electrical service interface card is in electrical communication with one of the I/O connectors 108, and for redundancy, each I/O connector 108 is in electrical communication with a pair of electrical service interface cards. For example, the I/O connector 108a is electrically connected to the I/O interfaces 110 of electrical service interface cards 104a and 104b. Similarly, the I/O connector 108b is electrically connected to the I/O interfaces 110 of electrical service interface cards 104c and 104d; the I/O connector 108c to the I/O interfaces 110 of electrical service interface cards 104i and 104j; and the I/O connector 108d to the I/O interfaces 110 of electrical service interface cards 104k and 104L.

In general, each electrical service interface card 104m and 104n, which occupy slots numbered thirteen and fourteen, respectively, provides 1:4 equipment protection for electrical services arriving by way of the I/O connectors 108. The electrical service interface card 104m protects electrical services passing through I/O connectors 108a and 108b and has a 1:4 protection I/O interface 112 that is electrically connected to these two I/O connectors. Similarly, the electrical service interface card 104n protects electrical services passing through I/O connectors 108c and 108d and has a 1:4 protection I/O interface 112 that is electrically connected to these two I/O connectors. Together, these service interface cards 104m, 104n can provide 1:4 equipment protection for multiple different electrical services.

For example, consider that electrical signals associated with DS3 services are passing to and from the I/O connector 108a and those associated with an E1 service are passing to and from I/O connector 108c. Service interface cards 104a and 104b are handling the DS3 traffic, while service interface cards 104i and 104j handle the E1 traffic. If the service interface card 104b fails, then the electrical service interface card 104m can assume the role of the service interface card 104b supporting the DS3 service. Meanwhile, the other electrical service interface card 104n continues to protect E1 traffic should either service interface card 104i, 104j fail.

Figure 5:
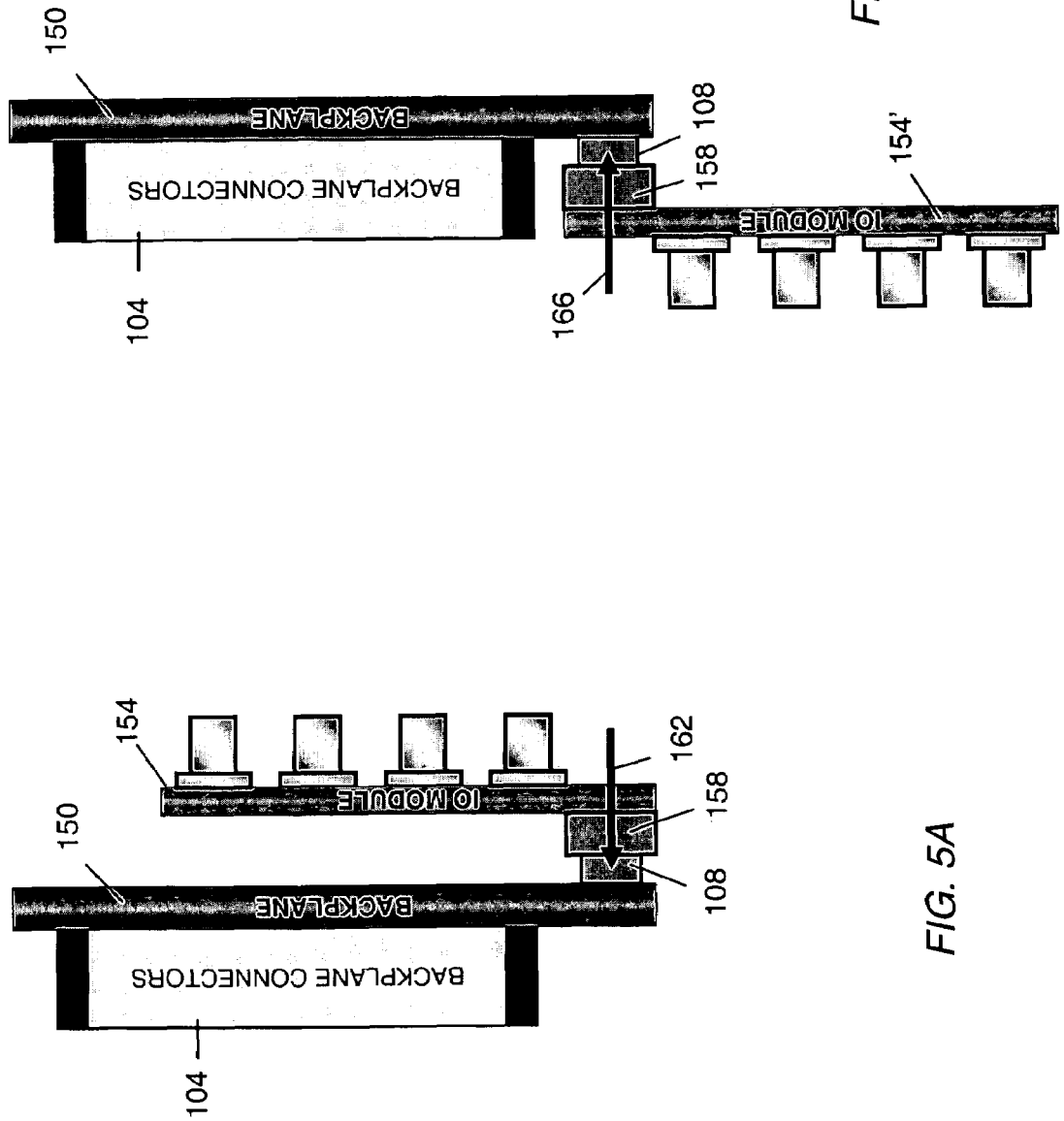
FIG. 5A is a side view of an embodiment of the network element in which an I/O module is connected to the rear side of a backplane.
FIG. 5B is a side view of an embodiment of the network element in which an I/O module is connected to the front side of a backplane.

FIG. 5A illustrates an embodiment of a rear-side electrical connection between the backplane 150 of the network element and an I/O module 154. This rear-side connection occurs between the electrical I/O connector 108 (FIG. 4) and an electrical connector 158 of the I/O module 154. The arrow 162 indicates the direction of connection. In this embodiment, the I/O module 154 is parallel to and directly opposite the rear side of the backplane 150. On the front side of the backplane 150 are the electrical backplane connectors 104 (FIG. 4) for receiving the various cards (e.g., service interface cards) of the network element.

Rear-side I/O connections are typical in North American commercial markets. In contrast, European commercial markets typically require front-side I/O connections. The backplane 150 has a through-hole construction that enables installing the I/O connector 108 on either side of the backplane 150, depending upon the particular market. An electrical connector can thus attach to the I/O connector 108 from either side of the backplane 150. In another embodiment, the backplane 150 has a first I/O connector 108 on the front side and a second I/O connector 108 on the rear side, both electrically connected to one or more backplane connectors 104, to enable an I/O module to connect to the backplane from either side FIG. 5B illustrates an embodiment of a front-side electrical connection between the backplane 150 and an I/O module 154'. As with the rear-side connection of FIG. 5A, the I/O connector 108 connects to the electrical connector 158 of the I/O module 154'. The arrow 166 indicates the direction of the connection between the electrical connectors 108, 158. When connected to the backplane 150, the I/O module 154 is disposed below the backplane connectors 104 that are used to connect the various cards to the backplane 150.

In one embodiment, the I/O module 154 is an E1 I/O panel that connects to two I/O connectors 108. For example, one E1 I/O panel has two electrical connectors 158, one for each I/O connector 108 on the backplane 150. The E1 I/O panel can support four 63×E1 service interface cards (i.e., 252 E1 services). With two such E1 I/O panels, an electrical/optical network element can support as many as 504 protected E1 services. In another embodiment, the I/O module 154 is a DS3 I/O panel that connects to one I/O connector 108 on the backplane 150 and supports two 24×DS3 services, as described in co-pending U.S. patent application Ser. No. 10/790,570, filed Mar. 1, 2004, the entirety of which application is incorporated by reference herein. An electrical/optical network element having four I/O connectors 108 can thus support as many as 192 protected DS3 services.

Figure 6:
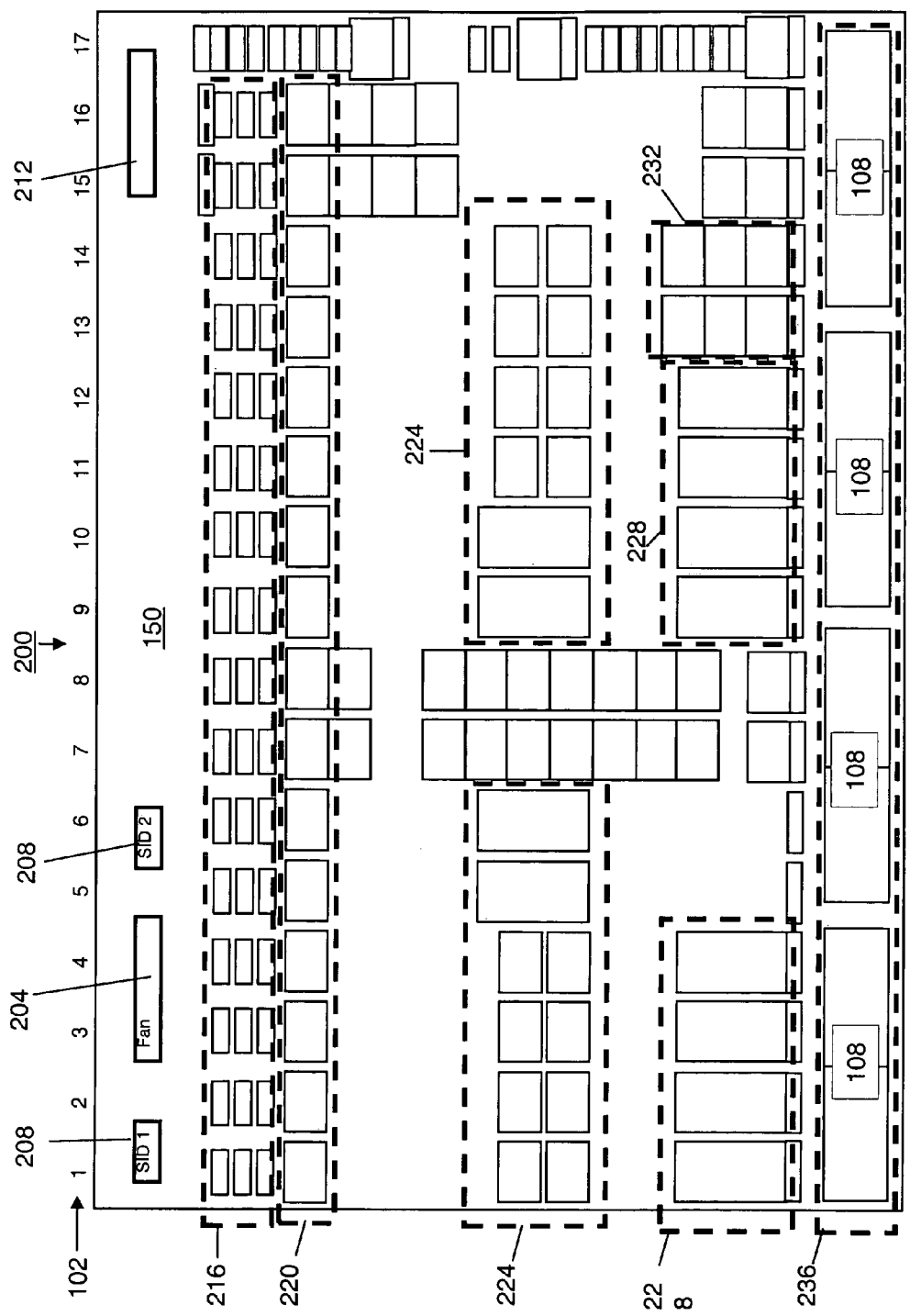
FIG. 6 is a schematic block diagram of an embodiment of the backplane of the invention.

FIG. 6 shows a front side of an embodiment of a schematic 200 of the backplane 150 of the invention. The cooling system, access panel, power cards, maintenance interface card, shelf processors, XC cards, service interface cards, and electrical interfaces (i.e., I/O modules) interconnect through the backplane 150. The backplane 150 has various mechanisms for providing inter-card communications and control. A first mechanism includes communication links between each service interface card and the XC and shelf processors for OAM communications (i.e., using internal Ethernet 10/100BaseT LAN communications). A second mechanism includes communication links for sending status information between adjacent service interface cards and XC cards (called VBUS links). A third mechanism includes communication links for sending status information between the shelf processor card and the service interface cards (called low-level links or LLL). A fourth mechanism includes dedicated links between cards to provide presence, inventory, and control signaling. Electrical traces at various layers of the backplane 150 provide the communication and dedicated links. The backplane 150 also provides access to the shelf identification and configuration type, power distribution and synchronization distribution (both phase and frequency) to all cards in the network element, and traffic signal interconnection between the service interface cards and the XC cards.

The backplane 150 has a multi-layer construction with plated through-holes (or vias) for making electrical connections to the electrical traces at the different layers. The various electrical connectors on the front side of the backplane 150 are arranged generally in columns and rows. Each column of electrical connectors corresponds to a card slot for receiving one circuit pack (i.e., service interface cards, XC cards, SP cards), and each row of electrical connectors corresponds to a section of the backplane with electrical traces for carrying a particular type of electrical signals between circuit packs. The sections include a fan connector interface 204, a SID interface 208, an access panel interface 212, a power interface 216, a control interface 220, a traffic interface 224, an electrical interface 228, a protection interface 232, and an I/O module interface 236. In general, the different sections restrict certain types of signals (for implementing the above-described mechanisms) to particular regions of the backplane 150.

Located on the left side of the backplane 150, near the top edge, are the fan connector interface 204 and the SID interface 208. This location places the fan connector interface 204 in proximity of any fan module 42 to be coupled to the network element (thus keeping short in length any electrical wires or leads). The fan connector interface 204 includes an electrical connector by which the fan module 42 (FIG. 1) can couple to and decouple from the backplane 150. The SID interface 208 provides access to redundant critical shelf information, such as the shelf ID and the configuration type. On the right side of the backplane 150, near the top edge, the access panel interface 212 includes a connector for attaching to the access panel 34 (FIG. 1). This location likewise places the connector in close proximity of the access panel 34 disposed at the top of the network element.

Below the fan connector interface 204, SID interface 208, and access panel interface 212, is the power interface section 216. This section 216 extends horizontally across each card slot (102) of the backplane 150 (except slot 17) and comprises three modules for each slot. Each of these cards has a connector for electrically connecting to the three modules in the power interface section 216. By way of the power interface, each service interface card, XC card, and SP card obtains power.

Immediately below the power interface section 216 is the control interface section 220, which also extends horizontally across each card slot of the backplane 150. The control interface section 220 includes a connector block for each card slot. Each service interface card, XC card, and SP card has an electrical connector for connecting to this connector block in a given slot. The connector blocks are horizontally aligned so that a card can enter any slot. Through these connector blocks, the service interface cards, XC cards, and SP cards exchange control-related signaling, such as maintenance testing, shelf-level communications (e.g., Ethernet, LLL), synchronization (e.g., SETS, line time), and card-to-card communications.

Approximately midway between the top and bottom edges of the backplane 150 is the traffic interface section 224. The pin field of the traffic interface section 224 supports a plurality of traffic paths (e.g., 10×2.5G) to both XC slots (seven and eight) and traffic paths (e.g., 10×2.5G) between mate slots (e.g., slot one and two, and slots three and four) for transponder applications. Other functions of the traffic interface section 224 include 1) signaling VBUS communications between service interface cards and from the service interface cards to the XC cards, and 2) operating as a state machine interface for master/slave selection.

In a lower region of the backplane, each electrical interface section 228 includes a connector block for each card slot that can receive an electrical service interface card (i.e., slots 1-4 and 9-12). A plurality of signal lines electrically connects each connector block to one of the four I/O connectors 108 at the bottom edge of the backplane 150. The four I/I connectors 108 are included in the I/O module interface section 236 located along the bottom edge of the backplane 150.

The protection interface section 232 also includes connector blocks for connecting the electrical service interface cards to the backplane 150. A plurality of signal lines electrically connects each of these connector blocks to two of the four I/O connectors 108 (as described above in connection with FIG. 4).

Figures 7A, 7B:
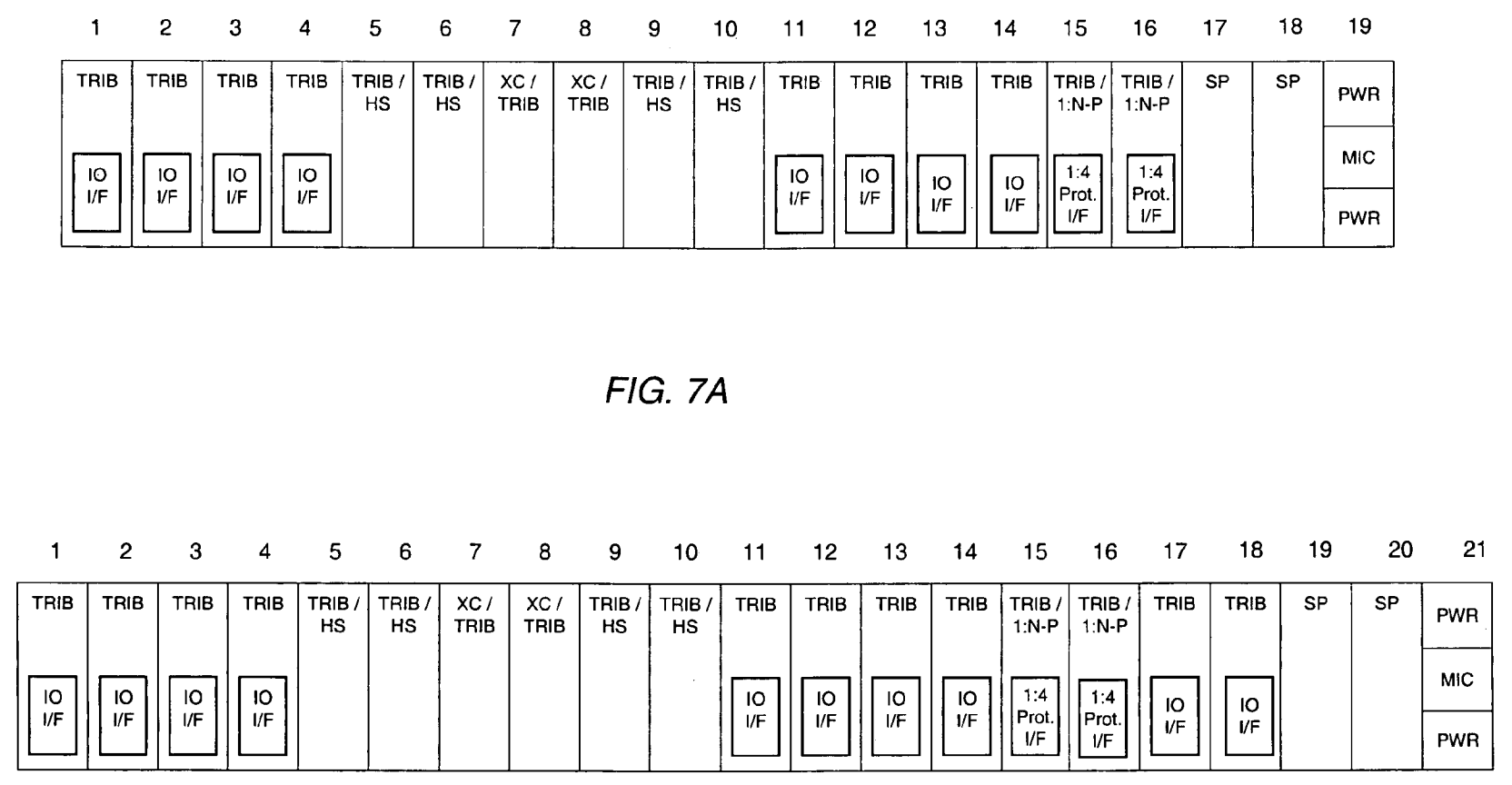

The layout of the various connector blocks on the backplane 150 is scalable for horizontal and vertical expansion. For horizontal expansion, additional slots can be inserted, for example, between slots 14 and 15 of the backplane 150. For example, FIG. 7A shows a system block diagram of a network element with two additional slots. This embodiment has a 500 mm wide shelf footprint. As another example, FIG. 7B shows a system block diagram of a network element with four additional slots and a 546 mm wide shelf footprint. Electrical service interface cards installed in these additional slots can provide 1:1 equipment protection for any other electrical service interface cards in the network element that are supporting electrical services.

For vertical expansion, the connector block layout can produce an additional row of cards (i.e., double the height of the network element with two rows of cards). Another feature of the backplane layout is that for each service interface card slot there are unused regions of the backplane (e.g., between the control interface 220 and traffic interface 224 sections) within which to implement additional capabilities of the network element.

While the invention has been shown and described with reference to specific preferred embodiments, it should be understood by those skilled in the art that various changes in form and detail may be made therein without departing the spirit and scope of the invention as defined by the following claims. For example, although the backplane is herein described as having front-side electrical connectors for receiving circuit packs, the principles of the invention can also apply to backplanes that use rear-side electrical connectors to receive the circuit packs. Also, variations as to where the air plenum and fan module are removably attached to the network element and as to the direction of airflow can be made without departing from the principles of the invention.

What is claimed is:

1. A network element configurable for use in at least two different types of communications networks, the network element comprising:

a service interface card;

a service interface electrical connector for receiving the service interface card;

an I/O electrical connector for receiving an I/O module that carries electrical signals associated with one or more electrical services to and from the network element; and a backplane capable of installation in the network element irrespective of the communication network type of the at least two different types of communication networks for which the network element is being configured, the backplane having a first side, an opposite side, a first means for connecting the service interface electrical connector electrically and physically to the first side of the backplane, an electrical trace extending from the first connecting means to electrical contact means on the first side of the backplane and to electrical contact means on the opposite side of the backplane, and a second means for physically and electrically connecting the I/O electrical connector to electrical contact means on the first side of the backplane if the network element is configured according to a first configuration for use in a first type of communication network and to electrical contact means on the opposite side of the backplane if the network element is configured according to a second configuration for use in a second type of communication network, wherein the electrical trace electrically connects the I/O electrical connector to the first connecting means irrespective of the side of the backplane to which the I/O electrical connector is physically connected.

2. The network element of claim 1, wherein the backplane defines a plurality of slot locations into which cross-connect cards can be installed if the network element is configured for switching traffic, otherwise, into which service interface cards can be installed if the network element is configured for wavelength transponding.

3. The network element of claim 1, wherein the backplane defines a plurality of slot locations into which service interface cards and cross-connect cards can be installed, the slot locations for the cross-connect cards being in general centrally located among the slot locations for the service interface cards.

4. The network element of claim 1, further comprising a second service interface card for providing 1:N equipment protection, where N is any number in the range of one to four, inclusive.

5. The network element of claim 1, wherein the backplane defines a plurality of card slots with approximately a 25 mm pitch.

6. The network element of claim 1, further comprising a fan module removably coupled to a top of the network element and electrically connected to the backplane.

7. The network element of claim 6, wherein a direction in which the fan module exhausts air depends upon a configuration of the network element, the fan module being adapted to exhaust air in a front direction if the network element is configured according to the first configuration, in a rear direction if the network element is configured according to the second configuration, and in a top direction if the network element is configured according to a third configuration.

8. The network element of claim 1, further comprising an optical service interface card having a plurality of ports, each port of the plurality of ports on the optical service interface card being individually configurable for one of the SONET and SDH communications networks.

9. The network element of claim 8, wherein one port of the optical service interface card is configured for SONET and another port of the optical service interface card is configured for SDH.

10. The network element of claim 1, wherein the I/O electrical connector is a first I/O electrical connector, the I/O module is a first I/O module, and the first I/O electrical connector is connected to the first I/O module, and wherein the backplane further comprises a second I/O electrical connector electrically connected to a second service interface electrical connector and to a second I/O module, the first I/O module supporting a first plurality of electrical services and the second I/O module supporting a second plurality of electrical services of a different type than the first plurality of electrical services.

11. The network element of claim 10, further comprising a plurality of service interface cards each providing 1:N equipment protection for the first and second pluralities of electrical services, where N is any number in the range of one to four, inclusive.

12. The network element of claim 11, wherein the first plurality of electrical services is DS3 services and the second plurality of electrical services is E1 services.

13. A network element configurable for use in at least two different types of communications networks, the network element comprising:

means for forwarding network traffic received over a communications network;

a backplane capable of installation in the network element irrespective of the communication network type of the at least two different types of communication networks for which the network element is being configured, the backplane having a first side and an opposite side;

a first means for connecting the forwarding means to the first side of the backplane;

a second means for physically and electrically connecting an I/O module to one of the sides of the backplane, the second connecting means connecting the I/O module to the first side of the backplane if the network element is configured for a first type of communications network and connecting the I/O module to the opposite side of the backplane if the network element is configured for a second type of communications network; and means for electrically connecting the first connecting means to the second connecting means irrespective of the side of the backplane to which the I/O module is physically and electrically connected in order to provide an electrical connection between the forwarding means and the I/O module.

14. The network element of claim 13, further comprising means for drawing air into the network element and across the forwarding means and for exhausting the air in a front direction if the network element is configured for the first type of communications network, in a rear direction if the network element is configured for the second type of communications network, and in a top direction if the network element is configured for a third type of communications network.

15. The network element of claim 13, further comprising means for providing 1:N equipment protection for a plurality of different types of electrical services, where N is any number in the range of one to four, inclusive.

16. The network element of claim 13, further comprising a second forwarding means having a plurality of ports for receiving and forwarding traffic, and wherein each port of the plurality of ports is individually configurable for one of the first and second communications networks.

17. A network element configurable for use in at least two different types of communications networks, the network element comprising:

a plurality of circuit packs;

a backplane capable of installation in the network element irrespective of the communication network type of the at least two different types of communication networks for which the network element is being configured, the backplane having a plurality of columns of electrical connectors and a plurality of rows of electrical connectors attached on one side of the backplane, each column of electrical connectors corresponding to a card slot for receiving one of the plurality of circuit packs, each row of electrical connectors corresponding to a section of the backplane with electrical traces for carrying a particular type of electrical signals between circuit packs, the backplane having a row of I/O electrical connectors for connecting I/O modules to the backplane, the row of I/O electrical connectors being connected to the one side of the backplane if the network element is configured for a first type of communications network and to an opposite side of the backplane if the network element is configured for a second type of communications network, each I/O electrical connector being electrically connected by an electrical trace to one of the electrical connectors in the same column as that I/O electrical connector irrespective of the side of the backplane to which that I/O electrical connector is physically connected.

18. The network element of claim 17, wherein one section of the backplane distributes power signals to each of the circuit packs and another section carries control signaling between the circuit packs.

19. A method for configuring a network element for use in at least two different types of communications networks, the method comprising:

installing a backplane in the network element irrespective of the type of communication network of the at least two different types of communication networks for which the network element is being configured, the backplane having a front side and a back side;

connecting a plurality of service interface cards to the one of the front and back sides of the backplane; and connecting an I/O module to the front side of the backplane if the network element is to be configured for a first type of communications network, otherwise connecting the I/O module to the back side of the backplane if the network element is to be configured for a second type of communications network.

20. The method of claim 19, further comprising coupling a separable fan module to a top of the network element, the fan module being configured to exhaust air in one of a front direction, rear direction, and top direction depending upon whether the network element is being configured for use in the first type of communications network or for the second type of communications network.

21. The method of claim 19, wherein one of the service interface cards has a plurality of ports, and further comprising provisioning a first port of the plurality of ports for communicating according to SONET and a second port of the plurality of ports for communicating according to SDH.

* * * * *